US012593570B2

(12) United States Patent
Wang et al.

(10) Patent No.: US 12,593,570 B2
(45) Date of Patent: *Mar. 31, 2026

(54) DISPLAY SUBSTRATE AND DISPLAY DEVICE WITH LIGHT TRANSMITTING REGION HAVING HOLLOW PART

(71) Applicant: BOE TECHNOLOGY GROUP CO., LTD., Beijing (CN)

(72) Inventors: Hejin Wang, Beijing (CN); Mingche Hsieh, Beijing (CN); Pinfan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 380 days.

This patent is subject to a terminal disclaimer.

(21) Appl. No.: 18/341,162

(22) Filed: Jun. 26, 2023

(65) Prior Publication Data

US 2023/0337479 A1 Oct. 19, 2023

Related U.S. Application Data

(63) Continuation-in-part of application No. 17/522,507, filed on Nov. 9, 2021, now Pat. No. 11,812,640, (Continued)

(30) Foreign Application Priority Data

Sep. 30, 2018 (CN) .......................... 201811161433.X

(51) Int. Cl.
*H10K 59/122* (2023.01)
*H10K 59/126* (2023.01)
*H10K 59/131* (2023.01)

(52) U.S. Cl.
CPC ......... *H10K 59/122* (2023.02); *H10K 59/126* (2023.02); *H10K 59/131* (2023.02)

(58) Field of Classification Search
CPC ... H10K 59/122; H10K 59/131; H10K 59/126
See application file for complete search history.

(56) References Cited

U.S. PATENT DOCUMENTS 9,306,190 B2 4/2016 Kim et al.
11,189,672 B2 * 11/2021 Wang ................... H10K 59/122
(Continued)

FOREIGN PATENT DOCUMENTS

CN 1550857 A 12/2004
CN 203456471 U 2/2014
(Continued)

OTHER PUBLICATIONS

Notice of Allowance for U.S. Appl. No. 16/571,570 mailed Jul. 29, 2021, 7 pages.
(Continued)

*Primary Examiner* — Lex H Malsawma
(74) *Attorney, Agent, or Firm* — Myers Bigel, P.A.

(57) ABSTRACT

The present disclosure provides a display substrate including a display region and a peripheral region surrounding it. The display region includes a light transmitting display region and a normal display region on at least one side thereof. The light transmitting display region includes a plurality of sub-pixel regions. At least one sub-pixel region of the plurality of sub-pixel regions includes a light emitting region and a transparent region. The display substrate includes a base substrate, a display layer on a side of the base substrate and in the normal display region and the light transmitting display region. The display layer includes a plurality of insulating layers. A portion of the display layer in the transparent region has a first hollow part that extends through at least one insulating layer of the plurality of insulating layers. The present disclosure also relates to a display device including the display substrate.

16 Claims, 10 Drawing Sheets

Related U.S. Application Data which is a continuation of application No. 16/571,570, filed on Sep. 16, 2019, now Pat. No. 11,189,672.

(56) References Cited

U.S. PATENT DOCUMENTS

| | | |
|---|---|---|
| 2004/0189919 A1 | 9/2004 | Ahn et al. |
| 2009/0140283 A1 | 6/2009 | Kawakami et al. |
| 2011/0169720 A1 | 7/2011 | Hwang et al. |
| 2012/0169683 A1* | 7/2012 | Hong ..................... H10K 59/35 |
| | | 345/206 |
| 2013/0256638 A1 | 10/2013 | Uesugi et al. |
| 2014/0183479 A1 | 7/2014 | Park et al. |
| 2016/0064411 A1 | 3/2016 | Park et al. |
| 2016/0126494 A1 | 5/2016 | Jung et al. |
| 2016/0172633 A1* | 6/2016 | Ahn ..................... H10K 59/121 |
| | | 257/40 |
| 2016/0351645 A1 | 12/2016 | You et al. |
| 2017/0068287 A1* | 3/2017 | Jung ........................ G02B 1/111 |
| 2017/0148861 A1 | 5/2017 | Kim |
| 2019/0235680 A1 | 8/2019 | Ma et al. |
| 2019/0296055 A1 | 9/2019 | Lius et al. |
| 2020/0117034 A1 | 4/2020 | Yin et al. |
| 2021/0202537 A1 | 7/2021 | Cao et al. |

FOREIGN PATENT DOCUMENTS

| | | |
|---|---|---|
| CN | 106711179 A | 5/2017 |
| CN | 107170791 A | 9/2017 |
| CN | 107195659 A | 9/2017 |
| CN | 206505399 U | 9/2017 |
| CN | 107359268 A | 11/2017 |
| CN | 107946321 A | 4/2018 |
| CN | 108269856 A | 7/2018 |
| CN | 207602574 U | 7/2018 |

OTHER PUBLICATIONS

Office Action for U.S. Appl. No. 17/522,507 mailed Mar. 3, 2023, 7 pages.

"First Office Action and English language translation, CN Application No. 201811161433.X, Mar. 16, 2020, 29 pp.".

"Non-Final Office Action", U.S. Appl. No. 16/571,570, Apr. 1, 2021, 12 pp.

"Rejection Decision and English language translation", CN Application No. 201811161433.X, Feb. 20, 2021, 27 pp.

"Second Office Action and English language translation", CN Application No. 201811161433.X, Aug. 26, 2020, 25 pp.

* cited by examiner

DISPLAY SUBSTRATE AND DISPLAY DEVICE WITH LIGHT TRANSMITTING REGION HAVING HOLLOW PART

RELATED APPLICATION

The present application is a continuation-in-part application of the application Ser. No. 17/522,507 entitled "OLED SUBSTRATE, MANUFACTURING METHOD THEREOF, TRANSPARENT DISPLAY" and filed on Nov. 9, 2021. The application Ser. No. 17/522,507 is a continuation application of the application Ser. No. 16/571,570 entitled "OLED SUBSTRATE, MANUFACTURING METHOD THEREOF, TRANSPARENT DISPLAY" and filed on Sep. 16, 2019. The application Ser. No. 16/571,570 claims the benefit of the Chinese patent application No. 201811161433.X, filed on Sep. 30, 2018. The entire disclosures of all the above previous applications are incorporated herein by reference.

FIELD

The present disclosure relates to the field of display technologies, and especially to a display substrate and a display device including the display substrate.

BACKGROUND

With the rapid development of science and technology, a variety of novel technologies are emerging. Transparent displays among them have received more and more attention due to their unique performance.

SUMMARY

According to the first aspect of the present disclosure, there is provided a display substrate including a display region and a peripheral region surrounding the display region, wherein the display region includes a light transmitting display region and a normal display region located on at least one side of the light transmitting display region, the light transmitting display region includes a plurality of sub-pixel regions, at least one sub-pixel region of the plurality of sub-pixel regions includes a light emitting region and a transparent region; wherein the display substrate includes a base substrate, and a display layer located on a side of the base substrate and in the normal display region and the light transmitting display region, the display layer includes a plurality of insulating layers, and a portion of the display layer in the transparent region has a first hollow part that extends through at least one insulating layer of the plurality of insulating layers.

According to some exemplary embodiments, the display layer includes a sub-pixel located in the light emitting region, the sub-pixel includes a pixel circuit and a light emitting element located on a side of the pixel circuit away from the base substrate, and the pixel circuit is configured to drive the light emitting element to emit light and the pixel circuit includes at least one thin film transistor, the thin film transistor includes an active layer, a gate located on a side of the active layer away from the base substrate, and a source and a drain located on a side of the gate away from the base substrate; the plurality of insulating layers include a gate insulating layer located between the active layer and the gate, an interlayer dielectric layer located between the gate and the source, and a planarization layer located on a side of the source and the drain away from the base substrate; and the first hollow part extends through at least one of the gate insulating layer, the interlayer dielectric layer and the planarization layer.

According to some exemplary embodiments, the first hollow part extends through the gate insulating layer, the interlayer dielectric layer and the planarization layer.

According to some exemplary embodiments, the light emitting element includes an anode, a light emitting functional layer and a cathode that are successively arranged away from the base substrate, the plurality of insulating layers further include a pixel defining layer located on a side of the anode away from the base substrate, the pixel defining layer includes an opening, the light emitting functional layer is located in the opening; and the first hollow part extends through the pixel defining layer.

According to some exemplary embodiments, the display substrate further includes a light shielding layer located in the light transmitting display region, the light shielding layer is located between the base substrate and the display layer, a portion of the light shielding layer in the transparent region includes a second hollow part, and an orthographic projection of the first hollow part on the base substrate at least partially overlaps an orthographic projection of the second hollow part on the base substrate.

According to some exemplary embodiments, the plurality of insulating layers further includes a buffer layer located between the active layer and the light shielding layer, and the first hollow part extends through the buffer layer.

According to some exemplary embodiments, the display substrate further includes an etch barrier layer located in the light transmitting display region and between the light shielding layer and the display layer; and the second hollow part extends through the etch barrier layer.

According to some exemplary embodiments, the etch barrier layer includes a transparent conductive layer.

According to some exemplary embodiments, the orthographic projection of the first hollow part on the base substrate coincides with the orthographic projection of the second hollow part on the base substrate.

According to some exemplary embodiments, the orthographic projection of the second hollow part on the base substrate is within the orthographic projection of the first hollow part on the base substrate.

According to some exemplary embodiments, the light shielding layer includes one or more of a black resin layer and a metal layer.

According to some exemplary embodiments, the light shielding layer includes a metal layer.

According to some exemplary embodiments, the display layer further includes a plurality of wirings electrically connected to the sub-pixels, some wirings of the plurality of wirings extend from the normal display region into the light transmitting display region, and an orthographic projection of a portion of the plurality of wirings in the light transmitting display region on the base substrate at least partially overlaps an orthographic projection of the light shielding layer on the base substrate.

According to some exemplary embodiments, the plurality of wirings include a plurality of gate lines extending along a first direction and a plurality of data lines extending along a second direction, and the first direction intersects with the second direction.

According to the second aspect of the present disclosure, there is provided a display device, including the display substrate according to the first aspect of the present disclosure; and a photosensitive sensor, wherein an orthographic projection of the photosensitive sensor on the display substrate at least partially overlaps the light transmitting display region.

According to some exemplary embodiments, the display layer includes a plurality of wirings electrically connected to the sub-pixels, some wirings of the plurality of wirings extend from the normal display region into the light transmitting display region, and an orthographic projection of a portion of the plurality of wirings in the light transmitting display region on the base substrate at least partially overlaps an orthographic projection of the light shielding layer on the base substrate.

According to some exemplary embodiments, the plurality of wirings include a plurality of gate lines extending along a first direction and a plurality of data lines extending along a second direction, and the first direction intersects with the second direction.

BRIEF DESCRIPTION OF THE DRAWINGS

In order to illustrate the embodiments of the present disclosure or the technical solutions in related art more clearly, the drawings to be used for description of the embodiments or the related art will be briefly described below. It is apparent that the drawings in the description below are only some of the embodiments of the present disclosure, and other drawings may be further obtained by a person having an ordinary skill in the art based on these drawings without spending inventive efforts.

Figure 1:
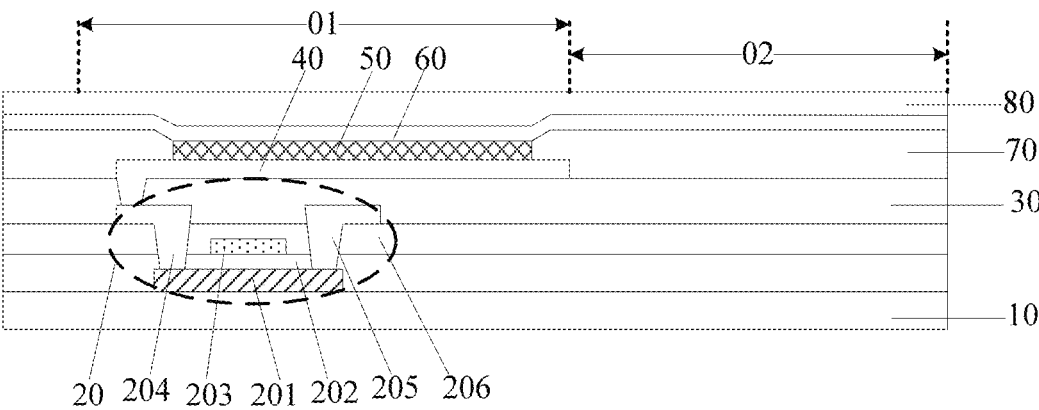
FIG. 1 is a schematic structural view of a transparent display provided by the related art.

It should be understood that the drawings of the description are only illustrations for the exemplary embodiments of the present disclosure and therefore do not need to be drawn in proportion. Moreover, identical components, parts or features are denoted by identical reference numerals throughout the present disclosure.

DETAILED DESCRIPTION

The technical solutions in embodiments of the present disclosure will be clearly and completely described below with reference to the accompanying drawings. It is obvious that the described embodiments are only a part of the embodiments of the present disclosure, rather than all of them. All other embodiments obtained by a person having an ordinary skill in the art based on the embodiments of the present disclosure without spending inventive efforts fall within the scope of the present disclosure.

Generally, a transparent display refers to a display which has a certain degree of light penetrability. For example, as shown in FIG. 1, the transparent display comprises both a light emitting region 01 and a transparent region 02. An important indicator for determining the performance of a transparent display panel is the transmittance of the transparent region 02, because its transmittance determines how much light can pass through the display panel, thereby affecting the brightness of an image acquired through the transparent region 02. However, as shown in FIG. 1, since film layers in the transparent display such as a gate insulating layer (GI) 202 and an interlayer dielectric layer (ILD) 206 in a thin film transistor (TFT) 20, a planarization layer 30, a pixel defining layer 70, and the like have low transmittance, and light will be reflected and refracted when passing through these film layers, the light transmittance of the transparent display is decreased, thereby degrading the user experience.

Figure 2:
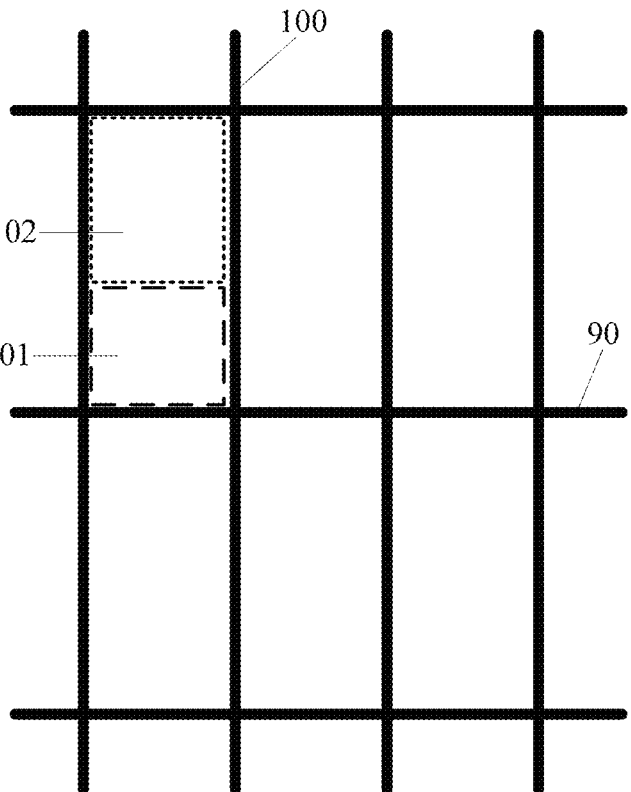
FIG. 2 is a schematic structural view of one sub-pixel region of a transparent display comprising a light emitting region and a transparent region provided by the related art.

Specifically, in the related art, a transparent organic light emitting display (OLED) comprises an OLED substrate comprising a light emitting region and a transparent region. The transparent region in the OLED substrate can be designed in the OLED substrate as needed. For example, as shown in FIG. 2, gate lines 90 and data lines 100 which intersect with each other enclose a plurality of sub-pixel regions, and one sub-pixel region is divided into a light emitting region 01 and a transparent region 02. Alternatively, it is also possible to arrange a transparent region every other pixel region (one pixel region comprises one or more sub-pixel regions, and the one or more sub-pixel regions are the light emitting region).

An embodiment of the present disclosure provides a display substrate that contributes to an improved transparent display effect.

Figure 3:
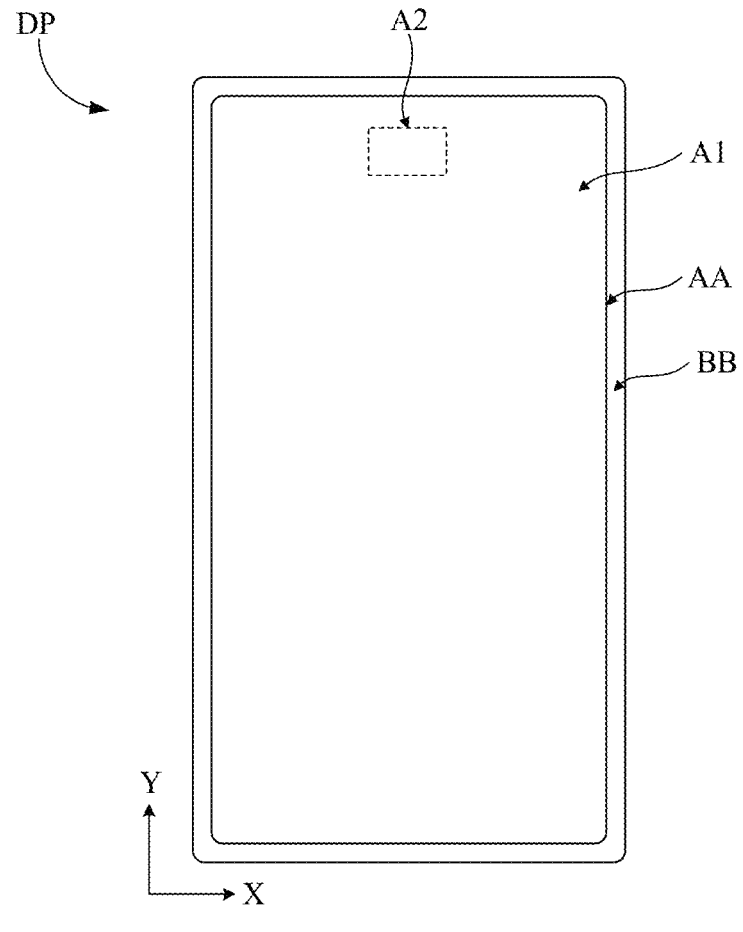
FIG. 3 is a schematic structural view of a display substrate provided by an embodiment of the present disclosure.

With reference to FIG. 3, it schematically shows the structure of a display substrate according to an exemplary embodiment of the present disclosure. As shown in FIG. 3, the display substrate DP comprises a display region AA and a peripheral region BB, wherein the peripheral region BB is a non-display region. The display region AA may comprise a first display region A1 and a second display region A2. The first display region A1 may be a normal display region, that is to say, the first display region A1 is used for display. The second display region A2 may be a light transmitting display region. In some examples, the second display region A2 may be realized as an Under Display Camera (UDC) region. As shown in FIG. 3, the display region AA may have the shape of a rectangle, such as a rounded rectangle, and the second display region A2 may have the shape of a circle. It should be understood that the present disclosure imposes no limitations on the shape of the second display region A2, for example, the second display region A2 may also have the shape of a rounded rectangle, rectangle, square, circle or any other suitable shape. The first display region A1 may be located on at least one side of the second display region A2, and the first display region A1 may surround the second display region A2. That is to say, the second display region A2 can be surrounded by the first display region A1. In other examples, the second display region A2 may be arranged in other positions, such as in the middle or top edge of the display region AA, or in the upper left or upper right corner of the display region AA. The present disclosure also imposes no limitations on the position of the second display region A2 in the display region AA.

The structure of the second display region A2 of the display substrate DP will be described specifically in conjunction with the drawings. For the sake of easy depiction, the display substrate DP is described as an OLED substrate in the following exemplary embodiments. However, it should be understood that the structure described in each exemplary embodiment can also be realized on any other type of display substrate to achieve a corresponding light transmitting display region therein. It should also be understood that the structure of the second display region A2 will be mainly described hereinafter, and the structure of the first display region A1 will not be reiterated.

Figure 4:
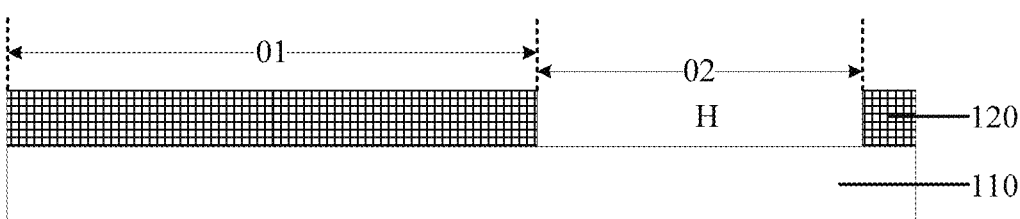
FIG. 4 is a schematic structural view of a display substrate provided by an embodiment of the present disclosure.

As shown in FIG. 4, the OLED substrate a light emitting region 01 and a transparent region 02. The OLED substrate comprises a substrate 110 and a display layer 120 on the substrate 110, wherein a portion of the display layer 120 located in the transparent region 02 has a first hollow part H.

It is to be noted that the substrate 110 refers to a structure under the display layer that realizes the display function in the OLED substrate, which may comprise a base substrate only, and may also comprise a base substrate and other film layers located between the base substrate and the display layer.

As used herein, a portion of the display layer 120 located in the transparent region 02 has a first hollow part H, which may mean that the portion of the display layer 120 located in the transparent region 02 is completely hollowed out, that is, the portion of the display layer 120 located in the transparent region 02 is completely removed, and may also mean that the portion of the display layer 120 located in the transparent region 02 is partially hollowed out, that is, the portion of the display layer 120 located in the transparent region 02 is partially removed, while other portions are retained.

In the above-described OLED substrate provided by an embodiment of the present disclosure, since the portion of the display layer 120 located in the transparent region 02 has the first hollow part H, loss of light caused by the display layer 120 when the light passes through the first hollow part H is avoided, so that the transmittance of light is enhanced when the light passes through the transparent region 02 of the OLED substrate. In case the above-described OLED substrate is applied to an OLED transparent display, the light transmittance of the transparent display is enhanced such that the brightness of an image acquired through the transparent region is increased, thereby improving the user experience.

Figure 5:
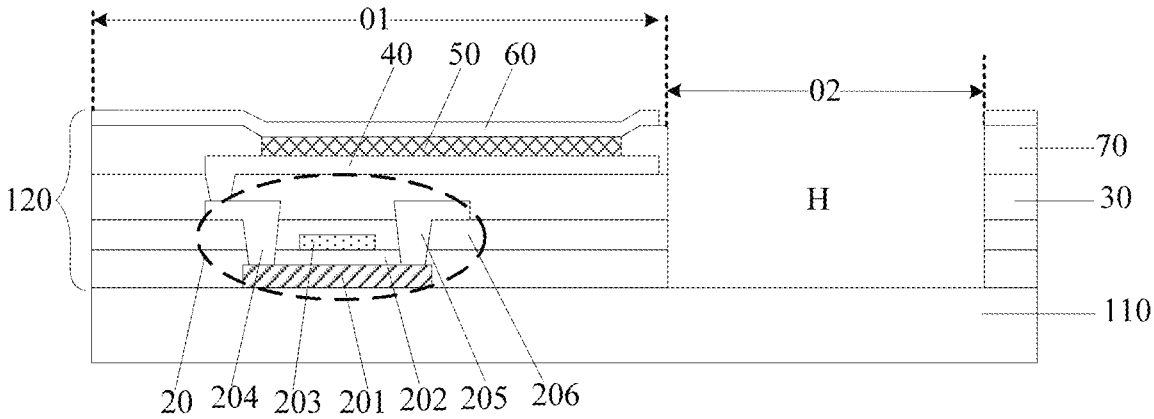
FIG. 5 is a schematic structural view of a display substrate provided by an embodiment of the present disclosure.

Specifically, as shown in FIG. 5, the display layer 120 may include, but is not limited to, a thin film transistor 20, a light emitting element, and a pixel defining layer 70. The thin film transistor 20 comprises an active layer 201, a gate insulating layer 202, a gate 203, an interlayer dielectric layer 206, a first terminal 205, and a second terminal 204. The second terminal 204 and the first terminal 205 are both connected to the active layer. The pixel defining layer 70 has a plurality of openings such that the light emitting element is disposed in a respective one of the openings. The light emitting element comprises an anode 40, a cathode 60, and a light emitting functional layer 50 sandwiched between the anode 40 and the cathode 60. The second terminal 204 of the thin film transistor 20 is electrically connected to the anode 40 of the light emitting element, thereby driving the light emitting element to emit light. The light emitting functional layer 50 of the light emitting element comprises a light emitting layer, and optionally, at least one of an electron transport layer, an electron injection layer, a hole transport layer, and a hole injection layer.

Further, as shown in FIG. 5, the display layer 120 may further comprise a planarization layer 30 which is disposed between the thin film transistor 20 and the light emitting element to provide a flat support surface for the light emitting element, to ensure uniformity of light emitted from the light emitting element.

Figure 6:
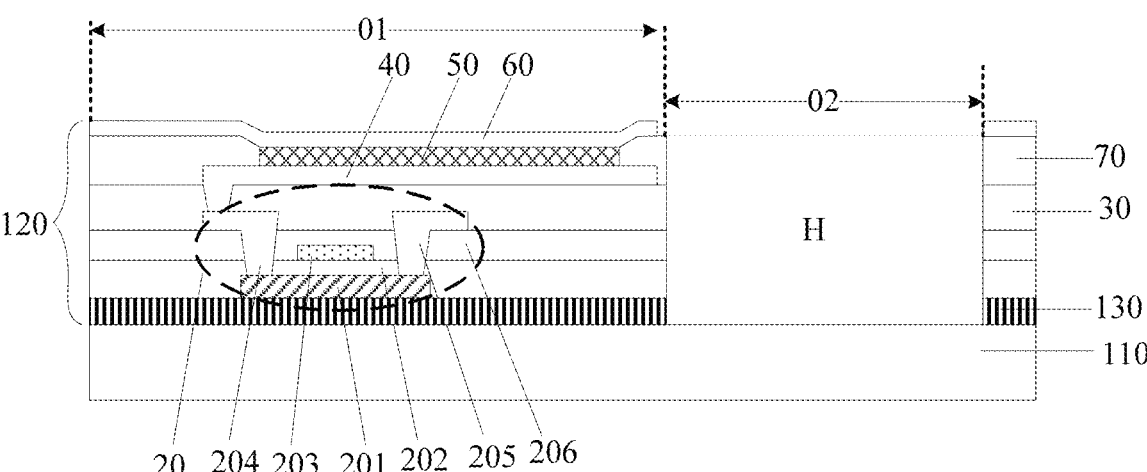
FIG. 6 is a schematic structural view of a display substrate provided by an embodiment of the present disclosure.

Further, as shown in FIG. 6, the display layer 120 may further comprise a buffer layer 130 disposed on the substrate 110, and the thin film transistor 20 and the light emitting element are disposed on the buffer layer 130. The buffer layer 130 can play the role of adjusting stresses, neutralizing charges, and the like.

Upon implementation, the first hollow part H of the display layer 120 may be formed by an etching process. The manufacturing process of the display layer 120 will be described in detail below based on an example in which the display layer 120 comprises the buffer layer 130, the thin film transistor 20, the planarization layer 30, and the light emitting element disposed on the substrate 110 successively.

As shown in FIG. 6, firstly, a buffer layer film is formed on the substrate 110 by, for example, a deposition process. Then, an active layer film is formed on the buffer layer film, and the active layer film is patterned to form an active layer 201. Next, a gate insulating layer film is formed on the active layer 201. A first conductive film is formed on the gate insulating layer film, and the first conductive film is patterned to form a gate 203. An interlayer dielectric layer film is formed on the gate 203, and portions of the interlayer dielectric layer film and the gate insulating layer film located in the light emitting region 01 are etched to form a first terminal contact hole and a second terminal contact hole. The interlayer dielectric layer film, the gate insulating layer film, and the buffer layer film located in the transparent region 02 are etched (for example, dry-etched) to form a portion of the first hollow part in the interlayer dielectric layer film, the gate insulating layer film, and the buffer layer film, to thereby form an interlayer dielectric layer 206, a gate insulating layer 202 and a buffer layer 130. Then, a second conductive film is formed on the interlayer dielectric layer 206. The second conductive film fills the first terminal contact hole and the second terminal contact hole, and the second conductive film is patterned to form a first terminal 205 and a second terminal 204. The first terminal 205 is connected to the active layer 201 via the first terminal contact hole, and the second terminal 204 is connected to the active layer 201 via the second terminal contact hole.

Next, a planarization film is formed on the first terminal 205 and the second terminal 204, the planarization film is patterned to form a via hole that exposes at least a portion of the second terminal 204, and to form a portion of the first hollow part in the planarization film in the transparent region 02, to form a planarization layer 30. A third conductive film is formed on the planarization layer 30, and the third conductive film is patterned to form an anode 40 which is electrically connected to the second terminal 204 through the via hole in the planarization layer 30. Then, a pixel defining layer film is formed on the anode 40, and the pixel defining layer film is patterned to form a pixel defining layer 70 which has an opening in the light emitting region 01 to expose the anode 40 of the light emitting element, and has a hollow part in the transparent region 02. A light emitting functional layer 50 and a fourth conductive film are formed successively in the opening of the pixel defining layer 70, and the fourth conductive film is patterned such that a portion of the fourth conductive film located in the transparent region 02 has a hollow part, and a cathode 60 of the light emitting element is formed.

In the above manufacturing process, the patterning of the active layer film, the first conductive film, the second conductive film, the third conductive film, the fourth conductive film, the planarization film, and the pixel defining layer film may include processes such as photoresist coating, exposure, development, etching, photoresist removal, and the like.

In the process of forming the display layer 120, an etching process needs to be used to form the first hollow part. If the display layer 120 is directly formed on the base substrate, when etching is being performed to form the display layer 120 comprising the first hollow part, the base substrate is easily over-etched, resulting in surface unevenness of the base substrate. The uneven surface of the base substrate 10 would scatter light incident thereon, thereby affecting the display effect of an OLED display.

Figure 7:
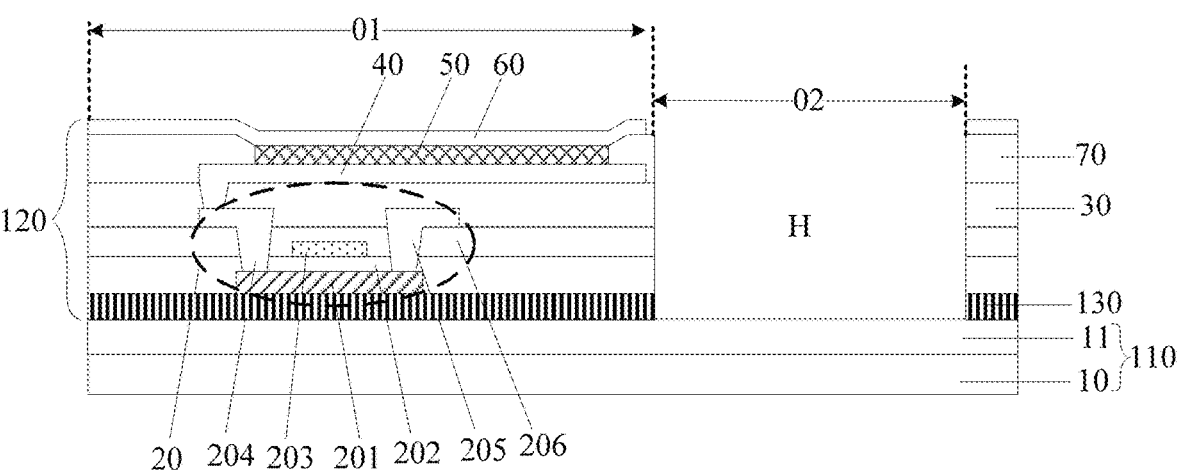
FIG. 7 is a schematic structural view of a display substrate provided by an embodiment of the present disclosure.

On this basis, in an exemplary embodiment of the present disclosure, as shown in FIG. 7, the substrate 110 comprises a base substrate 10 and a transparent etch barrier layer 11 located between the base substrate 10 and the display layer 120. The etch barrier layer 11 may be configured to block etching, that is, during etching, when etching proceeds to the etch barrier layer 11, the etching process stops automatically.

The material of the etch barrier layer 11 is not limited as long as it is capable of blocking etching during the etching process. For example, the material of the etch barrier layer 11 may be ITO (Indium Tin Oxide) and/or IZO (Indium Zinc Oxide). Here, since the etch barrier layer 11 is transparent, it does not affect the transmission of light.

In the above embodiment, the substrate 110 comprises base substrate 10 and the etch barrier layer 11. Since the etch barrier layer 11 can block etching during the process of etching the display layer 120, the surface of the substrate 110 can be kept flat, thereby effectively avoiding light scattering.

Figure 8:
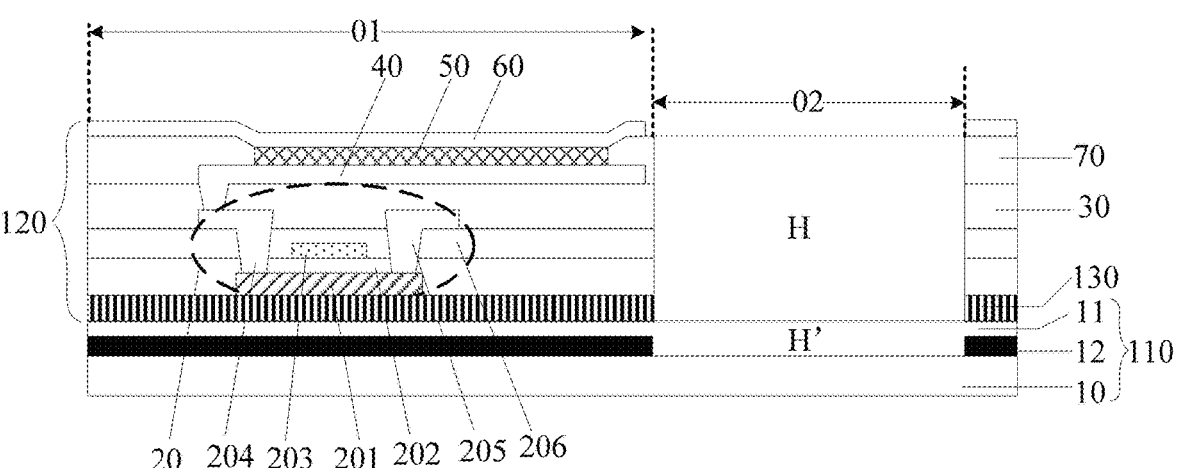
FIG. 8 is a schematic structural view of a display substrate provided by an embodiment of the present disclosure.
Figure 9:
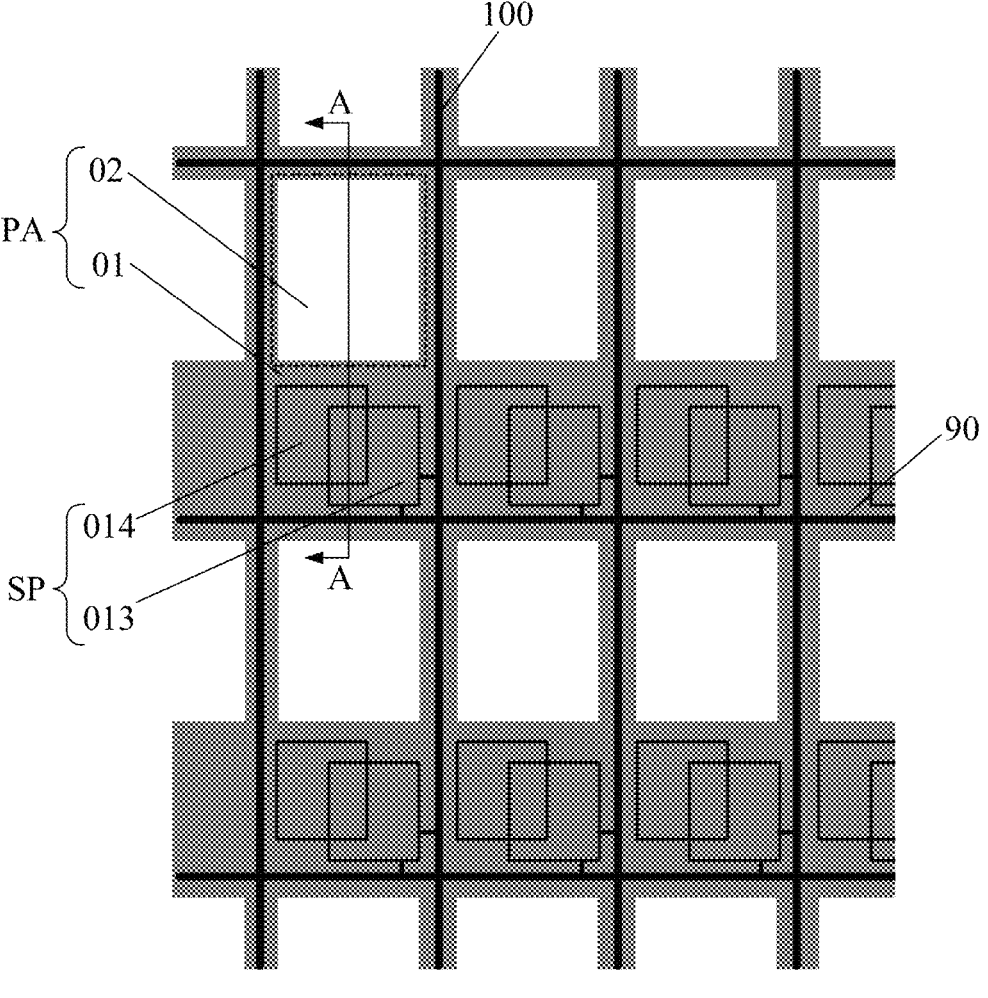
FIG. 9 is a schematic structural view of a display substrate provided by an embodiment of the present disclosure.

In an exemplary embodiment, as shown in FIGS. 8 and 9, the substrate 110 comprises a base substrate 10 and a light shielding layer 12 located between the base substrate 10 and the display layer 120. A portion of the light shielding layer 12 located in the transparent region 02 has a second hollow part H'.

Here, the material of the light shielding layer 12 is not limited as long as it is capable of shielding light. For example, the material of the light shielding layer 12 may be a black resin, a metal or the like. Since the thin film transistor

20 and the light emitting element need to be subjected to high-temperature treatment during the manufacturing process, and the metal is generally high temperature-resistant, embodiments of the present disclosure may advantageously employ a metal material as the material of the light shielding layer 12. However, in case the material of the light shielding layer 12 is a metal material, induced charges are easily generated on the light shielding layer 12, which may cause the voltage of the thin film transistor 20 to be unstable (floating). Therefore, in the case where the material of the light shielding layer 12 is a metal material and the substrate 110 comprises the etch barrier layer 11, the material of the etch barrier layer 11 may be advantageously selected as a transparent conductive material. Since the etch barrier layer 11 has electrical conductivity, it is possible to connect the etch barrier layer 11 to the wirings on the OLED substrate and apply a fixed voltage to the wirings, to ensure that the light shielding layer 12 and the etch barrier layer 11 have stable voltages, which in turn avoids the phenomenon that the light shielding layer 12 and the etch barrier layer 11 cause the voltage of the thin film transistor 20 to be unstable.

On this basis, when the material of the etch barrier layer 11 is a transparent conductive material, the material of the etch barrier layer 11 may be selected from at least one of ITO or IZO.

Upon implementation, a light shielding film may be formed on the base substrate 10, and then the light shielding film is patterned to form the light shielding layer 12.

In an exemplary embodiment, the orthographic projection of the first hollow part H on the base substrate 10 at least partially overlaps that of the second hollow part H' on the base substrate 10. For example, the orthographic projection of the second hollow part on the base substrate 10 coincides with that of the first hollow part on the base substrate 10. Alternatively, the orthographic projection of the second hollow part on the base substrate 10 is located within that of the first hollow part on the base substrate 10. Alternatively, the orthographic projection of the first hollow part on the base substrate 10 is located within that of the second hollow part on the base substrate 10.

Further with reference to FIG. 9, the light transmitting display region comprises a plurality of sub-pixel regions PA, and each sub-pixel region PA comprises a light emitting region 01 and a transparent region 02. In the light emitting region 01, there may be provided a sub-pixel SP comprising a pixel circuit 013 and a light emitting element 014. The pixel circuit 013 is configured to drive the light emitting element 014 to emit light.

The cross-sectional view taken along the line A-A of FIG. 9 may be shown as FIGS. 5 to 8, wherein the pixel circuit 013 may comprise at least one thin film transistor 20 comprising an active layer 201, a gate 203 located on a side of the active layer 201 away from the base substrate 10, and a first terminal 205 and a second terminal 204 located on a side of the gate 203 away from the base substrate 10; the light emitting element 014 is located on a side of the pixel circuit 013 away from the base substrate 10 and comprises an anode 40, a light emitting functional layer 50 and a cathode 60 that are successively arranged from the base substrate 10. Moreover, there may be included a plurality of insulating layers, such as a gate insulating layer 202 located between the active layer 201 and the gate 203, an interlayer dielectric layer 206 located between the gate 202 and the first terminal 205 and second terminal 204, and a planarization layer 30 located on a side of the first terminal 205 and the second terminal 204 away from the base substrate 10. The first hollow part H extends through at least one of the gate insulating layer 202, the interlayer dielectric layer 206 and the planarization layer 30. In the examples shown in FIGS. 5 to 8, the first hollow part H extends through the gate insulating layer 202, the interlayer dielectric layer 206 and the planarization layer 30.

FIG. 9 also shows that the display substrate comprises a plurality of gate lines 90 and a plurality of data lines 100, wherein the gate lines 90 extend along the first direction (such as the horizontal direction in FIG. 9) and the data lines 100 extend along the second direction (such as the vertical direction in FIG. 9), and the first direction intersects with the second direction. The gate lines 90 and the data lines 100 are all electrically connected to the corresponding pixel circuits 013. It should be understood that as for the display substrate DP, the gate lines 90 and the data lines 100 all extend within the scope of the entire display substrate DP, so the gate lines 90 and the data lines 100 shown in FIG. 9 are sections of the corresponding gate lines and data lines in the second display region A2.

Figure 10:
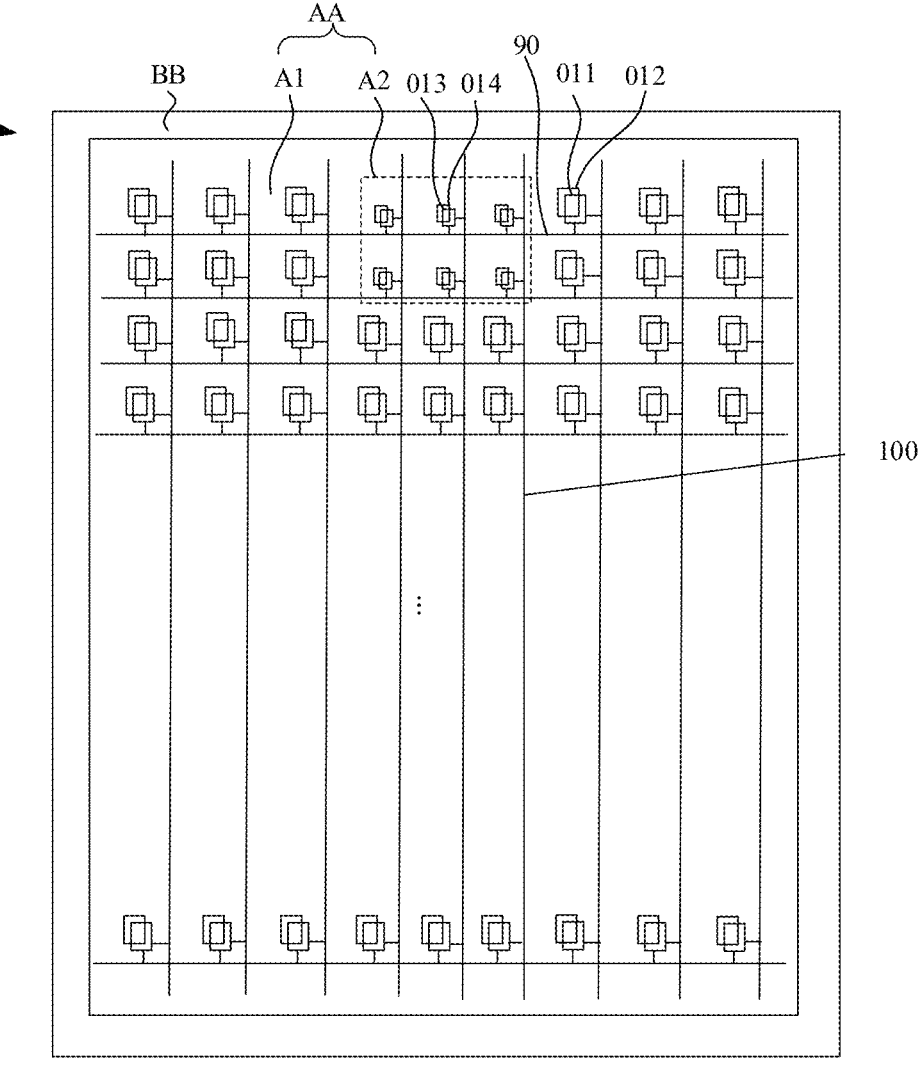
FIG. 10 is a schematic structural view of a display substrate provided by an embodiment of the present disclosure.

FIG. 10 schematically shows the structure of the display substrate according to an exemplary embodiment of the present disclosure. As shown in FIG. 10, the display substrate DP comprises a first display region A1 and a second display region A2. The first display region A1 comprises a plurality of sub-pixels, and each sub-pixel comprises a first pixel circuit 011 and a first light emitting element 012; and the second display region A2 comprises a plurality of sub-pixels, and each sub-pixel comprises a second pixel circuit 013 and a second light emitting element 014. The plurality of data lines 100 and the plurality of gate lines 90 extend from the first display region A1 into the second display region A2. The gate lines 90 extend along the first direction, and a portion of the gate lines 90 are electrically connected to the first pixel circuits 011 in the first display region A1 and the second pixel circuits 013 in the second display region A2; and the date lines 100 extend along the second direction that intersects with the first direction, and a portion of the date lines 100 are electrically connected to the first pixel circuits 011 in the first display region A1 and the second pixel circuits 013 in the second display region A2. Thus, in the second display region A2, the gate lines 90 and the data lines 100 are arranged as shown in FIG. 9.

Figure 11:
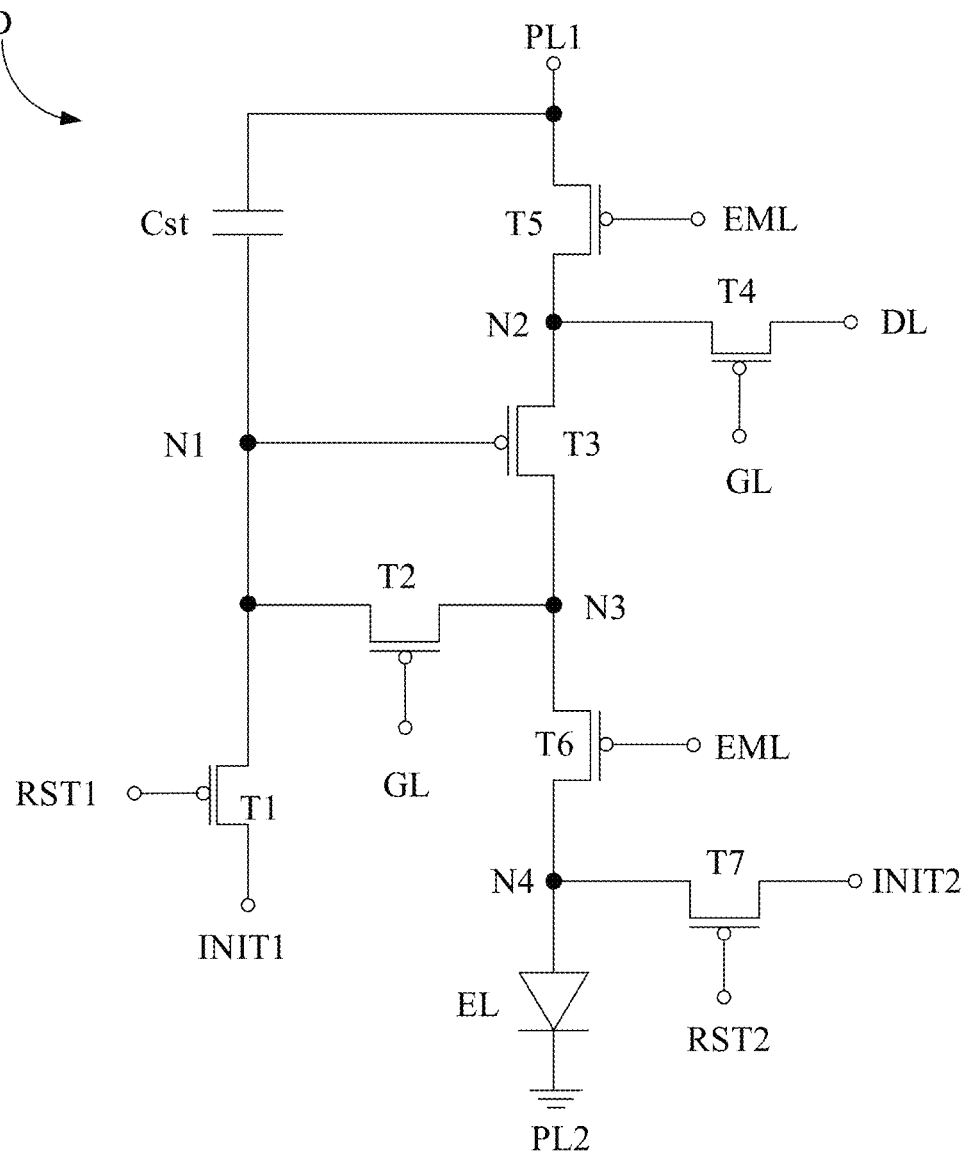
FIG. 11 is a schematic view of a pixel circuit provided by an embodiment of the present disclosure.

FIG. 11 is the schematic view of a pixel circuit provided by an embodiment of the present disclosure. As shown in FIG. 11, the pixel circuit D comprises six switch transistors (T1, T2, T4 to T7), a driving transistor T3 and a storage capacitor Cst. The six switch transistors are respectively a data write-in transistor T4, a threshold compensation transistor T2, a first light emitting control transistor T5, a second light emitting control transistor T6, a first reset transistor T1 and a second reset transistor T7. The light emitting element EL comprises an anode, a cathode and an organic light emitting layer disposed between the anode and the cathode.

In some exemplary embodiments, the driving transistor and the six switch transistors may be P-type transistors or N-type transistors. The use of the same type of transistors in the pixel circuit can simplify the processing flow, reduce the processing difficulty of the display substrate, and improve the yield rate of the product. In some possible implementations, the driving transistor and the six switch transistors may comprise P-type transistors and N-type transistors.

In some exemplary embodiments, the driving transistor and the six switch transistors may adopt low temperature poly-silicon thin film transistors, or oxide thin film transistors, or both the low temperature poly-silicon thin film transistors and the oxide thin film transistors. The active layer of the low temperature poly-silicon thin film transistor is made of low temperature poly-silicon (LTPS), and the active layer of the oxide thin film transistor is made of oxide semiconductor. The low temperature poly-silicon thin film transistor has the advantages of high mobility and fast charging and so on, and the oxide thin film transistor has the advantages of low leakage current and so on. The low temperature poly-silicon thin film transistors and the oxide thin film transistors are integrated on the display substrate to form a low temperature polycrystalline oxide (LTPO) display substrate, in such a way to make use of the advantages of the two to achieve low frequency drive, reduce power consumption and improve display quality.

In some exemplary embodiments, as shown in FIG. 11, the pixel circuit D comprises a scan line GL, a data line DL, a first power line PL1, a second power line PL2, a light emitting control line EML, a first initial signal line INIT1, a second initial signal line INIT2, a first reset control line RST1 and a second reset control line RST2. In some examples, the first power line PL1 is configured to provide a constant first voltage signal VDD to the pixel circuit, the second power line PL2 is configured to provide a constant second voltage signal VSS to the pixel circuit, and the first voltage signal VDD is greater than the second voltage signal VSS. The scan line GL is configured to provide a scan signal SCAN to the pixel circuit, the data line DL is configured to provide a data signal DATA to the pixel circuit, the light emitting control line EML is configured to provide a light emitting control signal EM to the pixel circuit, the first reset control line RST1 is configured to provide a first reset control signal RESET1 to the pixel circuit, and the second reset control line RST2 is configured to provide a second reset control signal RESET2 to the pixel circuit. In some examples, in the n-th row of pixel circuits, the first reset control line RST1 may be electrically connected to the scan line GL of the (n−1)th row of pixel circuits, so as to be inputted with the scan signal SCAN (n−1), that is, the first reset control signal RESET1 ($n$) is the same as the scan signal SCAN (n−1). The second reset control line RST2 may be electrically connected to the scan line GL of the n-th row of pixel circuits so as to be inputted with the scan signal SCAN (n), that is, the second reset control signal RESET2 ($n$) is the same as the scan signal SCAN (n). In some examples, the second reset control line RST2 electrically connected to the n-th row of pixel circuits and the first reset control line RST1 electrically connected to the (n+1)th row of pixel circuits are integrally formed. In this way, the signal lines of the display substrate can be reduced to realize the narrow frame of the display substrate. However, this embodiment does not impose any limitations thereon.

In some exemplary embodiments, the first initial signal line INIT1 is configured to provide the first initial signal to the pixel circuit, and the second initial signal line INIT2 is configured to provide the second initial signal to the pixel circuit. For example, the first initial signal and the second initial signal may be constant voltage signals, the magnitude of which may be between the first voltage signal VDD and the second voltage signal VSS, but is not limited thereto.

In some exemplary embodiments, as shown in FIG. 11, the driving transistor T3 is electrically connected to the light emitting element EL, and outputs a driving current under the control of the signals such as the scan signal SCAN, the data signal DATA, the first voltage signal VDD, and the second voltage signal VSS to drive the light emitting element EL to emit light. The gate of the data write-in transistor T4 is electrically connected to the scan line GL, the first terminal of the data write-in transistor T4 is electrically connected to the data line DL, and the second terminal of the data write-in transistor T4 is electrically connected to the first terminal of the driving transistor T3. The gate of the threshold compensation transistor T2 is electrically connected to the scan line GL, the first terminal of the threshold compensation transistor T2 is electrically connected to the gate of the driving transistor T3, and the second terminal of the threshold compensation transistor T2 is electrically connected to the second terminal of the driving transistor T3. The gate of the first light emitting control transistor T5 is electrically connected to the light emitting control line EML, the first terminal of the first light emitting control transistor T5 is electrically connected to the first power line PL1, and the second terminal of the first light emitting control transistor T5 is electrically connected to the first terminal of the driving transistor T3. The gate of the second light emitting control transistor T6 is electrically connected to the light emitting control line EML, the first terminal of the second light emitting control transistor T6 is electrically connected to the second terminal of the driving transistor T3, and the second terminal of the second light emitting control transistor T6 is electrically connected to the anode of the light emitting element EL. The first reset transistor T1 is electrically connected to the gate of the driving transistor T3, and is configured to reset the gate of the driving transistor T3, and the second reset transistor T7 is electrically connected to the anode of the light emitting element EL, and is configured to reset the anode of the light emitting element EL. The gate of the first reset transistor T1 is electrically connected to the first reset control line RST1, the first terminal of the first reset transistor T1 is electrically connected to the first initial signal line INIT1, and the second terminal of the first reset transistor T1 is electrically connected to the gate of the driving transistor T3. The gate of the second reset transistor T7 is electrically connected to the second reset control line RST2, the first terminal of the second reset transistor T7 is electrically connected to the second initial signal line INIT2, and the second terminal of the second reset transistor T7 is electrically connected to the anode of the light emitting element EL. The first electrode of the storage capacitor Cst is electrically connected to the gate of the driving transistor T3, and the second electrode of the storage capacitor Cst is electrically connected to the first power line PL1.

In this example, a first node N1 is a connecting point of the storage capacitor Cst, the first reset transistor T1, the driving transistor T3 and the threshold compensation transistor T2, a second node N2 is a connecting point of the first light emitting control transistor T5, the data write-in transistor T4 and the driving transistor T3, a third node N3 is a connecting point of the driving transistor T3, the threshold compensation transistor T2 and the second light emitting control transistor T6, and a fourth node N4 is a connecting point of the second light emitting control transistor T6, the second reset transistor T7 and the light emitting element EL.

It should be understood that the pixel circuit as shown in FIG. 11 has a 7T1C structure. However, the present disclosure does not impose any limitations thereon. For example, the pixel circuit may have a structure of 3T1C, 5T1C, 8T1C, 8T2C or the like.

Figure 12:
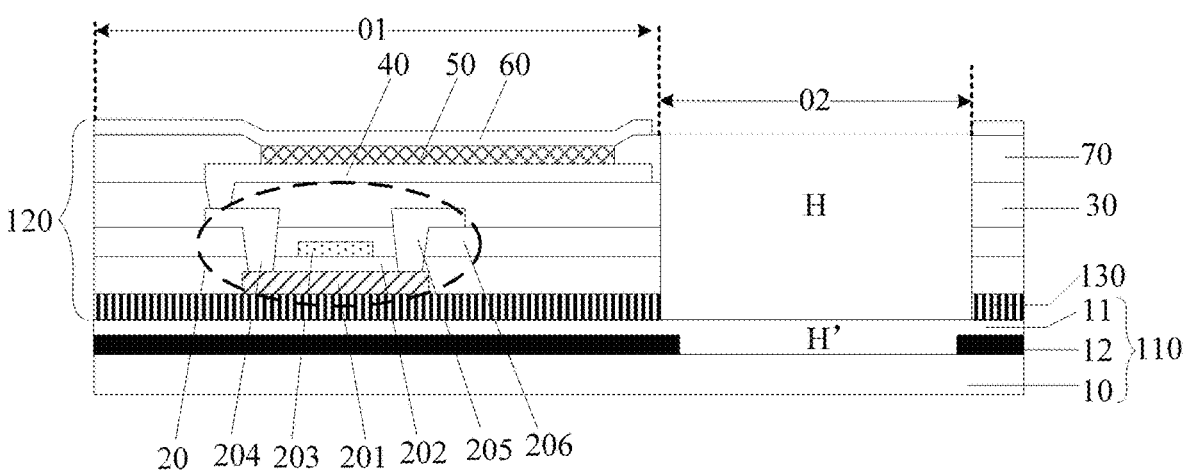
FIG. 12 is a schematic structural view of a display substrate provided by an embodiment of the present disclosure.
Figure 15:
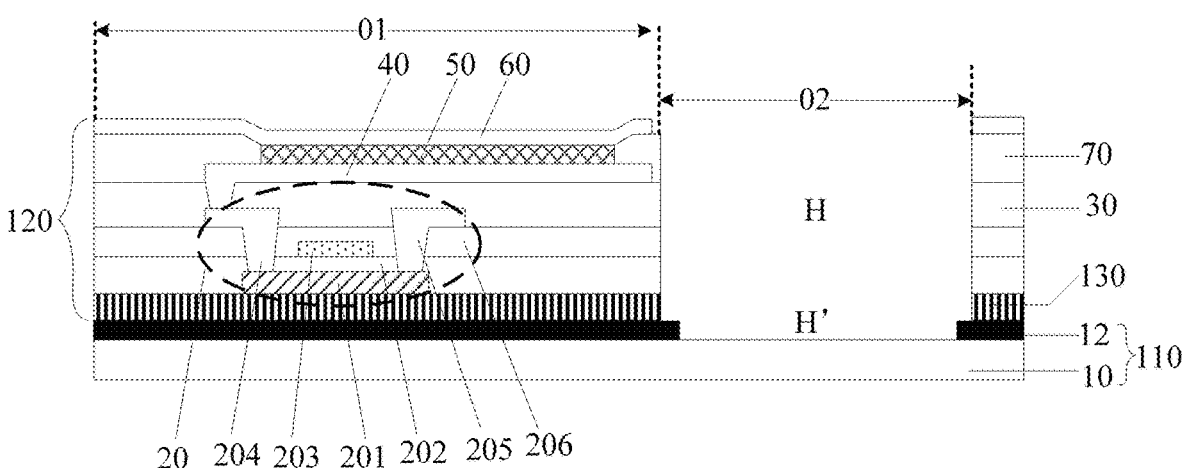
FIG. 15 is a schematic structural view of a display substrate provided by an embodiment of the present disclosure.

Inventors of the present disclosure have found that, when images are being acquired through the transparent region 02, an interference phenomenon occurs when light is incident on the edge of the first hollow part of the display layer 120, so that bright spots will appear in the images acquired through the transparent region 02. Therefore, advantageously, as shown in FIGS. 12 and 15, it is possible to make the orthographic projection of the second hollow part H' on the base substrate 10 located within that of the first hollow part H on the base substrate 10. In this way, when images are being acquired through the transparent region 02, the light shielding layer 12 can prevent light from being incident on the edge of the first hollow part H of the display layer 120, thereby avoiding the interference phenomenon occurring to light incident on the edge of the first hollow part H of the display layer 120.

Typically, the OLED substrate is provided with a plurality of wirings, such as gate lines 90, data lines 100, control lines, and the like. Since the wirings on the OLED substrate are very dense, it is easy to cause an optical interference phenomenon, which in turn directly affects the clarity of imaging. In an embodiment of the present disclosure, since the substrate 110 comprises the light shielding layer 12 disposed on the base substrate 10, and the light shielding layer 12 can shield light to prevent light from being incident on the wirings, the optical interference phenomenon resulting from the dense wirings can be avoided. In case the OLED substrate is applied to an OLED transparent display, the definition of the OLED transparent display can be improved. Further, the light shielding layer 12 can also prevent light from being incident on the active layer 201, thereby ensuring stable performance of the thin film transistor 20.

Here, when the substrate 110 comprises the base substrate 10, the etch barrier layer 11 and the light shielding layer 12, the etch barrier layer 11 may be disposed between the base substrate 10 and the light shielding layer 12, or the light shielding layer 12 may be disposed between the etch barrier layer 11 and the base substrate 10. When the orthographic projection of the second hollow part on the base substrate 10 is located within that of the first hollow part on the base substrate 10, in order to prevent the portion of the light shielding layer 12 that is exposed by the first hollow part H from being etched during the etching process for forming the display layer 120, optionally, as shown in FIG. 12, the light shielding layer 12 may be disposed between the etch barrier layer 11 and the base substrate 10.

Figure 13:
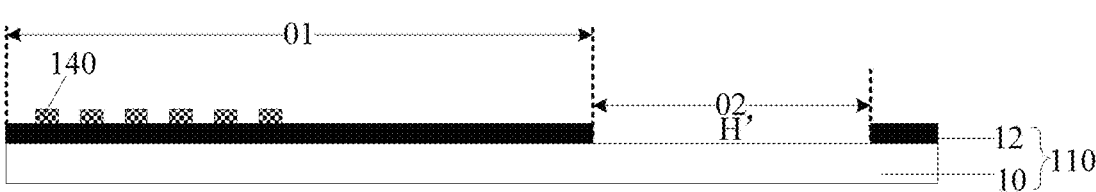
FIG. 13 is a schematic structural view of a display substrate provided by an embodiment of the present disclosure.

An embodiment of the present disclosure further provides an OLED substrate comprising, as shown in FIG. 13, a light emitting region 01 and a transparent region 02. The OLED substrate comprises a substrate 110 and wirings 140 on the substrate 110. The substrate 110 comprises a base substrate 10 and a light shielding layer 12 on the base substrate 10, wherein a portion of the light shielding layer 12 located in the transparent region 02 has a second hollow part H'.

Here, the type of the wirings 140 on the OLED substrate is not limited, and they may be the gate lines 90, the data lines 100, the control lines, and the like.

The material of the light shielding layer 12 is not limited, as long as it is capable of shielding light. For example, the material of the light shielding layer 12 may be a black resin or a metal, etc. Since the thin film transistor 20 and the light emitting element disposed on the OLED substrate need to be subjected to high-temperature treatment during the manufacturing process, and the metal is high temperature-resistant, the material of the light shielding layer 12 in embodiments of the present disclosure can be selected as a metal material.

Since the wirings on the OLED substrate are very dense, it is easy to cause an optical interference phenomenon, which in turn directly affects the clarity of imaging. In an embodiment of the present disclosure, since the OLED substrate comprises the substrate 110 and the wirings 140 disposed on the substrate 110, and the substrate 110 comprises the light shielding layer 12 disposed on the base substrate 10, the light shielding layer 12 can shield light to prevent light from being incident on the wirings 140, so that the optical interference phenomenon resulting from the dense wirings 140 can be avoided. In case the above OLED substrate is applied to an OLED transparent display, the definition of the OLED transparent display can be improved.

Figure 14:
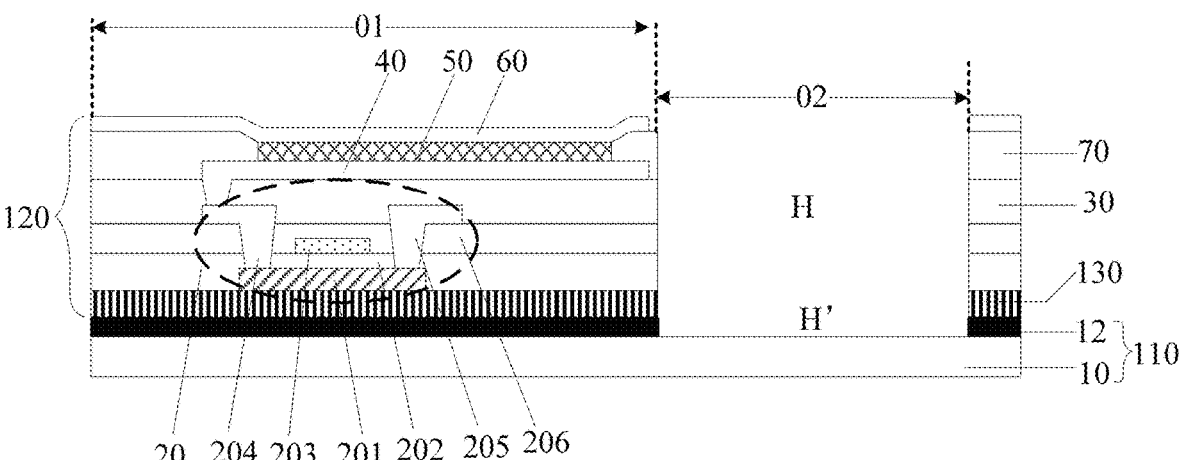
FIG. 14 is a schematic structural view of a display substrate provided by an embodiment of the present disclosure.

In an exemplary embodiment, as shown in FIG. 14 (the wirings 140 are not illustrated in FIG. 14), the OLED substrate comprises a display layer 120 disposed on the substrate 110, and a portion of the display layer 120 located in the transparent region 02 has a first hollow part H.

Specifically, as shown in FIG. 14, the display layer 120 may include, but is not limited to, a thin film transistor 20, a light emitting element, and a pixel defining layer 70. The thin film transistor 20 comprises an active layer 201, a gate insulating layer 202, a gate 203, an interlayer dielectric layer 206, a first terminal 205, and a second terminal 204. The second terminal 204 and the first terminal 205 are both connected to the active layer. The pixel defining layer 70 has a plurality of openings such that the light emitting element is disposed in a respective one of the openings. The light emitting element comprises an anode 40, a cathode 60, and a light emitting functional layer 50 sandwiched between the anode 40 and the cathode 60. The second terminal 204 of the thin film transistor 20 is electrically connected to the anode 40 of the light emitting element, thereby driving the light emitting element to emit light. The light emitting functional layer 50 of the light emitting element comprises a light emitting layer, and optionally, at least one of an electron transport layer, an electron injection layer, a hole transport layer, and a hole injection layer.

Further, as shown in FIG. 14, the display layer 120 may further comprise a planarization layer 30 disposed between the thin film transistor 20 and the light emitting element to provide a flat support surface for the light emitting element, ensuring uniformity of light emitted from the light emitting element.

Further, as shown in FIG. 14, the display layer 120 may further comprise a buffer layer 130 disposed on the substrate 110, and the thin film transistor 20 and the light emitting element are disposed on the buffer layer 130. The buffer layer 130 can play the role of adjusting stresses, neutralizing charges, and the like.

Upon implementation, the wirings 140 may be formed simultaneously with one or more layers of the display layer 120.

In the above-described OLED substrate provided by an embodiment of the present disclosure, since the portion of the display layer 120 located in the transparent region 02 has the first hollow part H, loss of light caused by the display layer 120 when the light passes through the first hollow part is avoided, so that the transmittance of light when the light passes through the transparent region 02 of the OLED substrate can be enhanced. In case the above-described OLED substrate is applied to an OLED transparent display, the light transmittance of the transparent display is enhanced, which increases the brightness of an image acquired through the transparent region, thereby improving the user experience.

In an exemplary embodiment, the orthographic projection of the first hollow part H on the base substrate 10 at least partially overlaps that of the second hollow part H' on the base substrate 10. For example, the orthographic projection of the second hollow part H' on the base substrate 10 coincides with that of the first hollow part H on the base substrate 10. Alternatively, the orthographic projection of the second hollow part H' on the base substrate 10 is located within that of the first hollow part H on the base substrate 10.

Alternatively, the orthographic projection of the first hollow part H on the base substrate 10 is located within that of the second hollow part H' on the base substrate 10.

Inventors of the present disclosure have found that, when images are being acquired through the transparent region 02, an interference phenomenon occurs when light is incident on the edge of the first hollow part H of the display layer 120, so that bright spots will appear in the images acquired through the transparent region 02. Therefore, advantageously, as shown in FIGS. 12 and 15, it is possible to make the orthographic projection of the second hollow part H' on the base substrate 10 located within that of the first hollow part H on the base substrate 10. In this way, when images are being acquired through the transparent region 02, the light shielding layer 12 can prevent light from being incident on the edge of the first hollow part of the display layer 120, thereby avoiding the interference phenomenon occurring to light incident on the edge of the first hollow part of the display layer 120.

Optionally, as shown in FIG. 12, the substrate 110 further comprises a transparent etch barrier layer 11 disposed between the base substrate 10 and the display layer 120.

Specifically, the etch barrier layer 11 may be disposed between the base substrate 10 and the light shielding layer 12, or the light shielding layer 12 may be disposed between the etch barrier layer 11 and the base substrate 10. When the orthographic projection of the second hollow part on the base substrate 10 is located within that of the first hollow part on the base substrate 10, in order to prevent the portion of the light shielding layer 12 that is exposed by the first hollow part from being etched during the etching process for forming the display layer 120, optionally, as shown in FIG. 12, the light shielding layer 12 may be disposed between the etch barrier layer 11 and the base substrate 10.

Here, the material of the etch barrier layer 11 is not limited as long as it is capable of blocking etching during the etching process. In an exemplary embodiment, when the material of the light shielding layer 12 is a metal material, induced charges are easily generated on the light shielding layer 12, and the induced charges may cause the voltage of the thin film transistor 20 to be unstable. Therefore, in the case where the material of the light shielding layer 12 is a metal material and the substrate 110 comprises the etch barrier layer 11, optionally, the material of the etch barrier layer 11 may be a transparent conductive material. Since the etch barrier layer 11 has electrical conductivity, it is possible to connect the etch barrier layer 11 to the wirings and apply a fixed voltage to the wirings, to ensure that the light shielding layer 12 and the etch barrier layer 11 have stable voltages, thereby avoiding the problem that the light shielding layer 12 and the etch barrier layer 11 cause the voltage of the thin film transistor 20 to be unstable. On this basis, when the material of the etch barrier layer 11 is a transparent conductive material, the material of the etch barrier layer 11 may be selected from at least one of ITO or IZO.

In the above embodiment of the present disclosure, since the substrate 110 comprises the etch barrier layer 11, the etch barrier layer 11 can prevent etching from proceeding to the substrate 110 during the process of etching the display layer 120, so that the surface of the substrate 110 remains flat and light scattering is avoided.

It should be understood that the structures described in the present disclosure in conjunction with the exemplary embodiments as shown in FIGS. 4 to 15 can all be applied to the second display region A2 in the display substrate DP shown in FIG. 3, so that the display substrate DP is implemented as a display substrate for partial light transmitting display.

Figure 16:
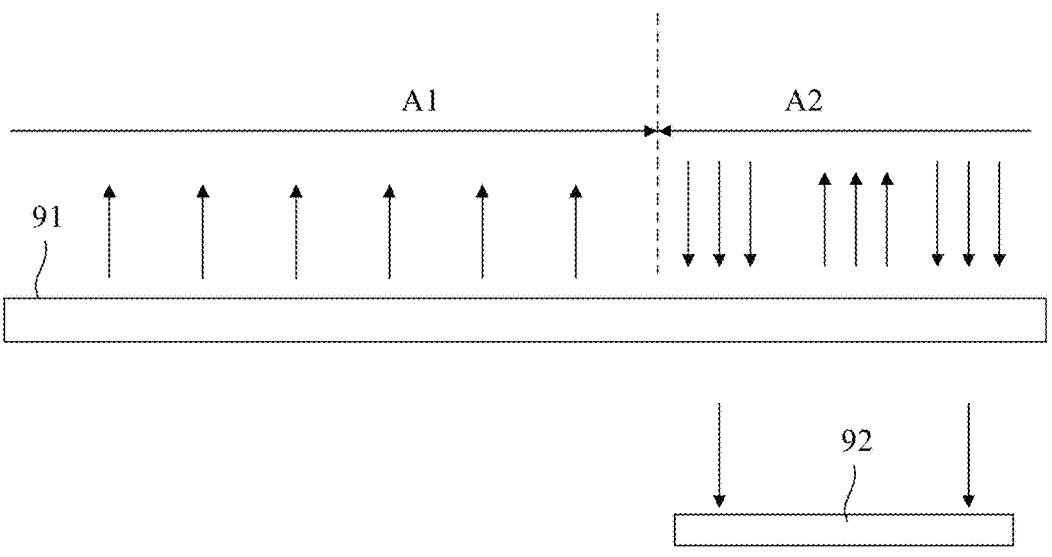
FIG. 16 is a schematic structural view of a display device provided by an embodiment of the present disclosure.

FIG. 16 is a schematic structural diagram of a display device provided by an embodiment of the present disclosure. As shown in FIG. 16, the display device comprises: a display substrate 91 and a photosensitive sensor 92 located on a light emergent side of a display structure layer away from the display substrate 91. The display substrate 91 may have various exemplary structures shown in FIGS. 3 to 15, and thus comprises the second display region A2 formed as a light transmitting display region. An orthographic projection of the photosensitive sensor 92 on the display substrate 91 overlaps with the second display region A2.

In some exemplary embodiments, the display substrate 91 may be a flexible OLED display substrate, a QLED display substrate, a Micro-LED display substrate, or a Mini-LED display substrate. The display device can be any product or component with a display function such as an OLED display, a mobile phone, a tablet computer, a TV, a monitor, a laptop, a digital photo frame, a navigator and the like, and the embodiments of the present disclosure are not limited thereto.

Figure 17:
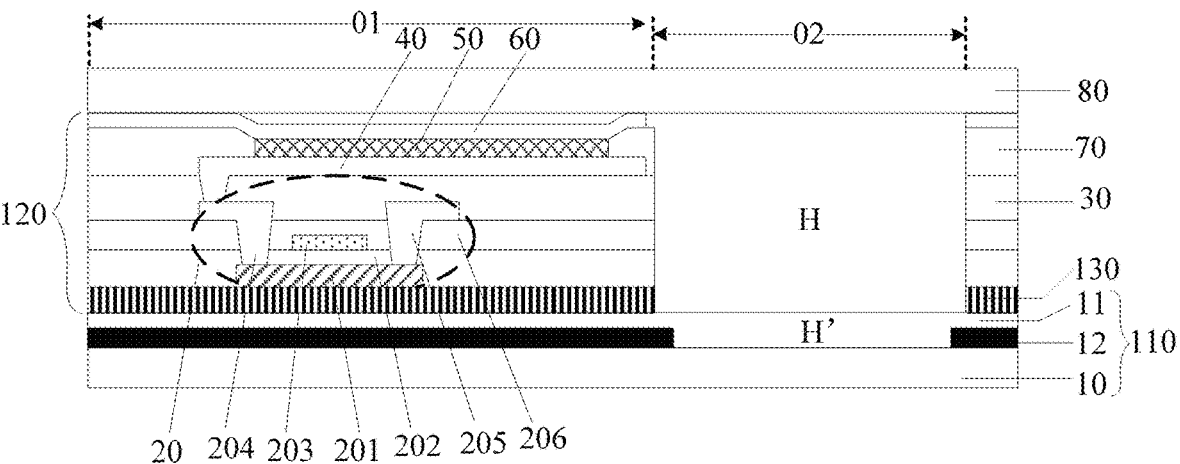
FIG. 17 is a schematic structural view of a transparent display provided by an embodiment of the present disclosure.
Figure 18:
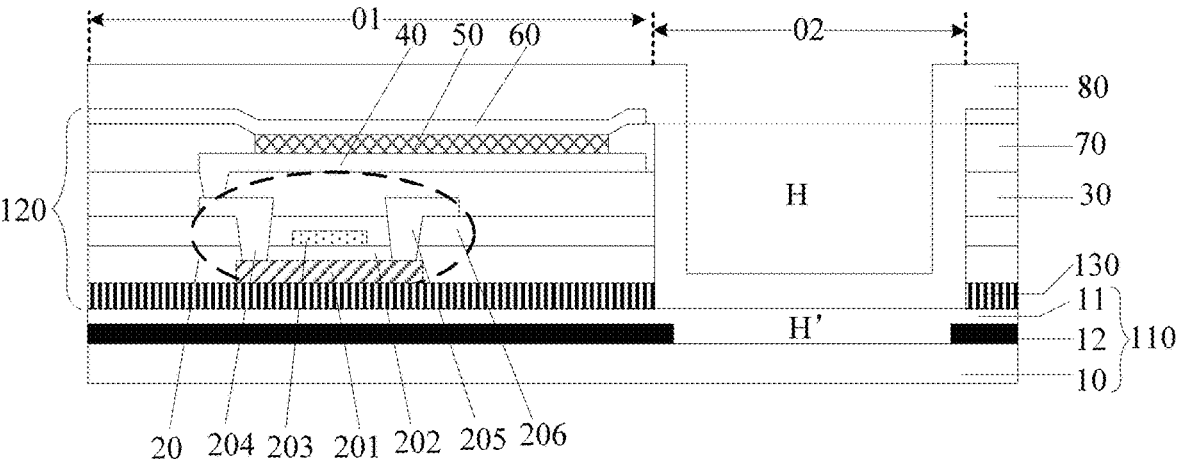
FIG. 18 is a schematic structural view of another transparent display provided by an embodiment of the present disclosure.

Further, an embodiment of the present disclosure provides a transparent display comprising, as shown in FIGS. 17 and 18, any of the OLED substrates described above and a package layer 80 for packaging the OLED substrate.

The package layer 80 may be a substrate package layer as shown in FIG. 17. Alternatively, the package layer 80 may also be a thin film package layer as shown in FIG. 18.

The transparent display may be any device that displays an image regardless of being moving (e.g., video) or fixed (e.g., still image) and regardless of being textual or graphic. More specifically, it is contemplated that the above-described embodiments can be implemented in or associated with a variety of electronic devices including, but not limited to, a mobile phone, a wireless device, a personal data assistant (PDA), a handheld or portable computer, a GPS receiver/navigator, a camera, an MP4 video player, a camera, a game console, a watch, a clock, a calculator, a TV monitor, a tablet display, a computer monitor, an automobile display (e.g., a mileage table display, etc.), a navigator, a cockpit controller and/or display, a camera view display (e.g., a display of a rear view camera in a vehicle), an electronic photo, an electronic billboard or signage, a projector, a building structure, a packaging and aesthetic structure (e.g., a display for an image of a piece of jewelry), and the like. In addition, the transparent display provided by the embodiment of the present disclosure may also be a transparent display panel.

An embodiment of the present disclosure provides a transparent display. When the portion of the display layer 120 of the OLED substrate in the transparent display which is located in the transparent region 02 has a first hollow part, since loss of light caused by the display layer 120 when the light passes through the first hollow part is avoided, the light transmittance of the transparent display is enhanced when light passes through the transparent region 02 of the transparent display, which increases the brightness of an image acquired through the transparent region 02, thereby improving the user experience. Further, when the OLED substrate in the transparent display comprises the substrate 110 and the wirings 140 disposed on the substrate 110, the substrate 110 comprises the base substrate 10 and the light shielding layer 12 disposed on the base substrate 10, and the portion of the light shielding layer 12 located in the transparent region 02 has a second hollow part, such that the optical interference phenomenon caused by the dense wirings 140 is avoided because the light shielding layer 12 can shield light to prevent the light from being incident on the wirings 140, thereby improving the definition of the OLED transparent display.

In the transparent display provided by the embodiment of the present disclosure, the base substrate 10 of the OLED substrate may be a rigid substrate or a flexible substrate. When the base substrate 10 is a flexible substrate, the base substrate 10 may be attached to a rigid substrate (such as a glass substrate), and then the display layer 120, the light shielding layer 12, or the etch barrier layer 11, etc. may be formed on the base substrate 10. After the transparent display has been manufactured, the base substrate 10 is peeled off the rigid substrate, thereby obtaining a flexible transparent display. In particular, the material of the flexible substrate may be, for example, polyimide.

What have been described above are merely specific embodiments of the present disclosure, but the scope of the present disclosure is not limited so. Any variations or substitutions that can be readily conceived by a skilled person familiar with this technical field within the technical scope revealed by the present disclosure shall be encompassed within the scope of the present disclosure. Thus, the scope of the present disclosure shall be determined by the scope of the appended claims.

The invention claimed is:

1. A display substrate comprising:

a display region; and a peripheral region surrounding the display region, wherein the display region comprises a light transmitting display region and a normal display region on at least one side of the light transmitting display region, the light transmitting display region comprises a plurality of sub-pixel regions, and at least one sub-pixel region of the plurality of sub-pixel regions comprises a light emitting region and a transparent region, and wherein the display substrate comprises:

a base substrate; and a display layer on a side of the base substrate and in the normal display region and the light transmitting display region, the display layer comprises a plurality of insulating layers, and a portion of the display layer in the transparent region has a first hollow part that extends through at least one insulating layer of the plurality of insulating layers, wherein the display substrate further comprises a light shielding layer in the light transmitting display region, the light shielding layer is between the base substrate and the display layer, a portion of the light shielding layer in the transparent region comprises a second hollow part, and an orthographic projection of the first hollow part on the base substrate at least partially overlaps an orthographic projection of the second hollow part on the base substrate.

2. The display substrate according to claim 1, wherein the display layer comprises a sub-pixel in the light emitting region, the sub-pixel comprises a pixel circuit and a light emitting element on a side of the pixel circuit away from the base substrate, and the pixel circuit is configured to drive the light emitting element to emit light and the pixel circuit comprises at least one thin-film transistor, wherein the thin-film transistor comprises an active layer, a gate on a side of the active layer away from the base substrate, and a source and a drain that are on a side of the gate away from the base substrate, wherein the plurality of insulating layers comprise a gate insulating layer between the active layer and the gate, an interlayer dielectric layer between the gate and the source, and a planarization layer on a side of the source and the drain away from the base substrate, and wherein the first hollow part extends through at least one of the gate insulating layer, the interlayer dielectric layer or the planarization layer.

3. The display substrate according to claim 2, wherein the first hollow part extends through the gate insulating layer, the interlayer dielectric layer and the planarization layer.

4. The display substrate according to claim 2, wherein the light emitting element comprises an anode, a light emitting functional layer and a cathode that are successively arranged away from the base substrate, wherein the plurality of insulating layers further comprise a pixel defining layer on a side of the anode away from the base substrate, wherein the pixel defining layer comprises an opening, and the light emitting functional layer is in the opening, and wherein the first hollow part extends through the pixel defining layer.

5. The display substrate according to claim 2, wherein the plurality of insulating layers further comprise a buffer layer between the active layer and the light shielding layer, and the first hollow part extends through the buffer layer.

6. The display substrate according to claim 1, wherein the display substrate further comprises an etch barrier layer in the light transmitting display region and between the light shielding layer and the display layer, and wherein the second hollow part extends through the etch barrier layer.

7. The display substrate according to claim 6, wherein the etch barrier layer is a transparent conductive layer.

8. The display substrate according to claim 1, wherein the orthographic projection of the first hollow part on the base substrate coincides with the orthographic projection of the second hollow part on the base substrate.

9. The display substrate according to claim 1, wherein the orthographic projection of the second hollow part on the base substrate is within the orthographic projection of the first hollow part on the base substrate.

10. The display substrate according to claim 1, wherein the light shielding layer comprises one or more of a black resin layer and a metal layer.

11. The display substrate according to claim 1, wherein the light shielding layer comprises a metal layer.

12. The display substrate according to claim 1, wherein the display layer further comprises a plurality of wirings electrically connected to sub-pixels, some wirings of the plurality of wirings extend from the normal display region into the light transmitting display region, and an orthographic projection of a portion of the plurality of wirings in the light transmitting display region on the base substrate at least partially overlaps an orthographic projection of a light shielding layer on the base substrate.

13. The display substrate according to claim 12, wherein the plurality of wirings comprise a plurality of gate lines extending along a first direction and a plurality of data lines extending along a second direction, and the first direction intersects with the second direction.

14. A display device, comprising:
the display substrate according to claim 1; and
a photosensitive sensor,
wherein an orthographic projection of the photosensitive sensor on the display substrate at least partially overlaps the light transmitting display region.

15. The display device according to claim 14, wherein the display layer comprises a plurality of wirings electrically connected to sub-pixels, some wirings of the plurality of wirings extend from the normal display region into the light transmitting display region, and an orthographic projection of a portion of the plurality of wirings in the light transmitting display region on the base substrate at least partially overlaps an orthographic projection of a light shielding layer on the base substrate.

16. The display device according to claim 15, wherein the plurality of wirings comprise a plurality of gate lines extending along a first direction and a plurality of data lines extending along a second direction, and the first direction intersects with the second direction.

* * * * *